United States Patent [19]
McCoy

[11] 3,867,646
[45] Feb. 18, 1975

[54] MOSFET CIRCUITRY FOR INTEGRATED CHIPS INTERFACING WITH HIGHER VOLTAGE DEVICES

[75] Inventor: Michael R. McCoy, San Jose, Calif.

[73] Assignee: Electronic Arrays, Inc., Mountain View, Calif.

[22] Filed: Oct. 5, 1973

[21] Appl. No.: 403,961

[52] U.S. Cl. .................. 307/251, 307/157, 307/205, 307/DIG. 1, 315/171, 315/173

[51] Int. Cl.. H05b 41/00, H03k 17/60, H03k 19/08

[58] Field of Search ....... 307/205, 214, 251, 260 A, 307/296, 157; 315/169 TV, 170, 171, 172, 173

[56] References Cited

UNITED STATES PATENTS

| | | | |
|---|---|---|---|
| 2,927,247 | 3/1960 | Hennis | 315/171 X |
| 3,739,200 | 6/1973 | D'Agostino | 307/251 X |
| 3,742,294 | 6/1973 | Wojcik | 315/169 TV |
| 3,778,673 | 12/1973 | Eisenberg | 315/170 X |

OTHER PUBLICATIONS

Sonoda, "Mosfet Powering Circuit;" IBM Tech. Discl. Bull., Vol. 13, No. 9; p. 2658; 2/1971.

*Primary Examiner*—Michael J. Lynch
*Assistant Examiner*—L. N. Anagnos
*Attorney, Agent, or Firm*—Ralf H. Siegemund

[57] ABSTRACT

An output terminal of a MOSFET chip is biased to a voltage in excess of the breakdown voltage of a MOSFET; a control transistor and a biased transistor are connected inside of the chip between the terminal and ground, so that for the nonconductive state of the control transistor only a reduced bias is effective across its main electrodes. The output terminal is connected, e.g., to the control circuit for a discharge device and for operating the control circuit between a relatively high firing voltage and a somewhat lower level.

4 Claims, 1 Drawing Figure

PATENTED FEB 18 1975
3,867,646
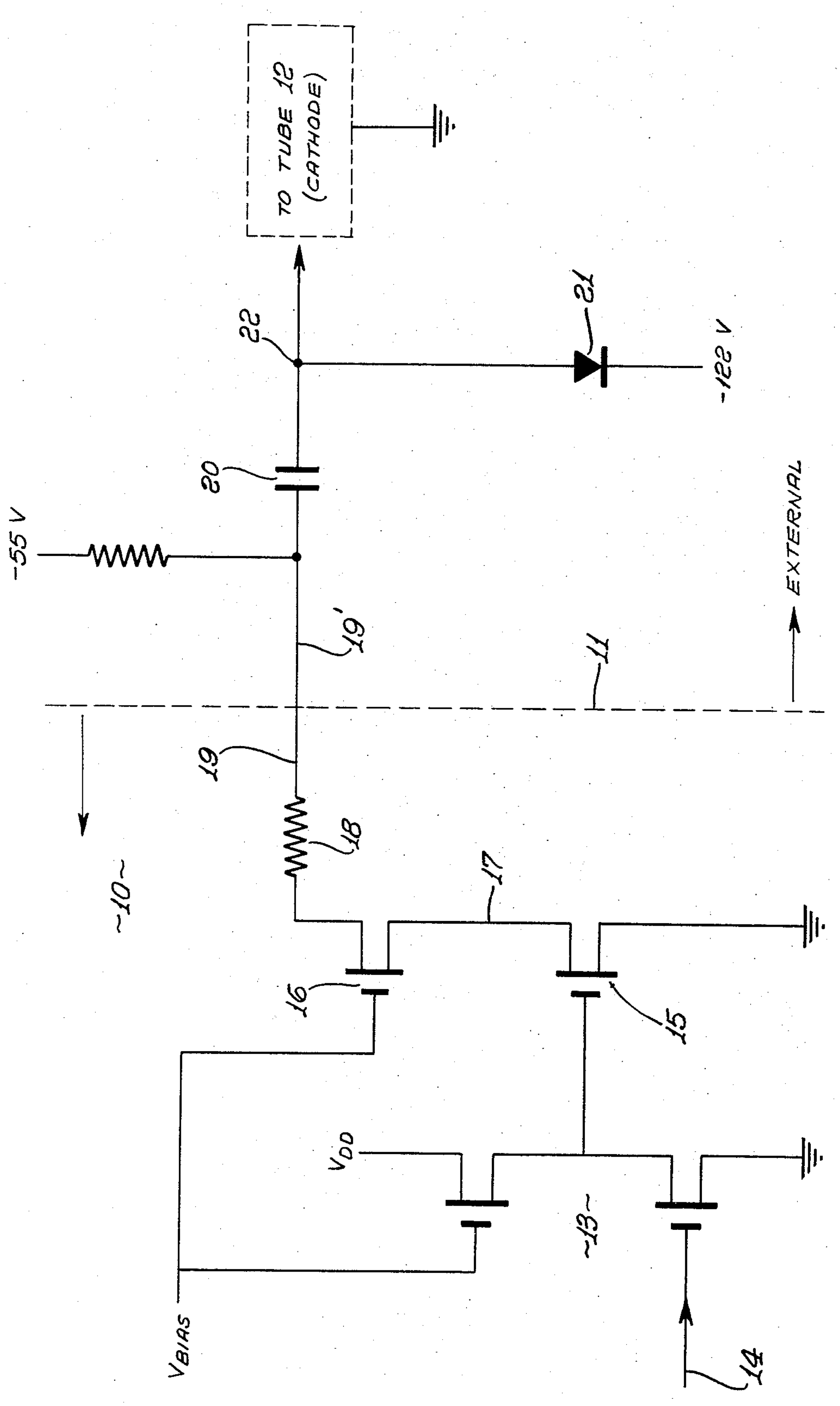

MOSFET CIRCUITRY FOR INTEGRATED CHIPS INTERFACING WITH HIGHER VOLTAGE DEVICES

BACKGROUND OF THE INVENTION

The present invention relates to control of relatively high voltage devices such as a display discharge tube from integrated circuits of the MOSFET variety.

Electronic calculators, minicomputers and the like use integrated circuits to a large extent, so that, for example, a complete calculator can be included in a few or even only one chip. These chips are then interconnected, i.e., connected to each other, and additionally, they interface with external input and output devices (e.g., input keys and display tubes, printers, etc.)

MOSFET chips are used frequently as integrated circuits, wherein the active elements are field effect transistors. These transistors, and such a MOSFET chip as a whole, operate over a limited voltage range such as 30 volts or less relative to ground. That voltage is considerably lower than needed to control, for example, a display discharge tube, which requires breakdown voltages well in excess of 100 volts.

Therefore, it has been the practice to use high voltage transistors as discrete, active circuit elements in the interface circuitry which is connected between output terminals of a MOSFET chip and such display tubes. Such high voltage transistors are expensive and add significantly to the cost of a calculator.

Previously, it has been believed that the output terminals of the MOSFET variety can be biased only to a voltage well below about 80 volts (−80 volts in a P-channel device). The reason for this is that 80 volts is the approximate breakdown voltage for a PN silicon junction generally. In reality, however, the gate of a MOSFET provides for a localized high field concentration in the near-surface region of the drain and/or source junction zones inside of the chip, and the respective junction diodes begins to "zener" already earlier. In reality then, breakdown of a MOSFET occurs already at about 35 volts between its source and drain electrodes. This phenomenon is, therefore, not conducive to attempt any control of high voltage devices directly from a MOSFET chip, i.e., without intervention of high voltage coupling circuitry that isolates the chip from voltages which could produce breakdown of the output FETs in the chip.

SUMMARY OF THE INVENTION

It is an object of the present invention to provide for circuit structure which permits control of relatively high voltage display discharge devices or the like from low voltage operated MOSFETs without interposing high voltage active elements such as high voltage transistors, tubes or the like. It is, therefore, an object of the invention to provide for circuit structure in a MOSFET chip which permits mere passive interfacing of the chip with higher voltage output devices.

In accordance with the preferred embodiment of the invention, a particular output terminal of a MOSFET chip is externally biased to a voltage against ground, well in excess of the internal breakdown voltage for MOSFETs, but in a manner permitting also raising of the potential through internal control from the chip to near ground, i.e., for a range also in excess of such breakdown voltage. The output circuitry in the chip and as effective on the biased output terminal includes a pair of serially connected MOSFETs, one being well biased to conduction by a gate voltage not too much below the operating voltage for the chip (e.g., −24 volts), the other MOSFET being internally controlled in accordance with the information to be outputted through that output terminal. Both serially interconnected transistors connect between the output terminal and, usually, the internally available ground in the chip.

The biased transistor is permanently conductive but conducts only when the control transistor is likewise conductive. Therefore, their common junction is isolated so that conduction through the bias transistor cannot pass current except through the control transistor. As a consequence, the voltage as actually effective across the control transistor, when not conductive, is the difference of the external bias as applied to the output terminal and the gate voltage of the bias transistor, as that later voltage is effective between its main electrodes when not conducting. The thus reduced source-to-drain voltage for the control MOSFET when not conductive must be below the breakdown voltage for such MOSFETs.

It follows, therefore, that the external bias can be almost as high as that internal breakdown voltage, plus a voltage that can be made available internally in the chip and which is not quite as high as the operating voltage for the active components in the chip. The resulting effective voltage level at the output terminal varies when the control transistor changes from conduction to nonconduction and vice versa over a range which is or can be made well in excess of the voltage swing otherwise controllable through MOSFETs inside of chips. Accordingly, mere passive circuitry can be used to connect the output terminal to a higher voltage breakdown device, such as a display tube whose breakdown voltage relative to ground is well in excess of any of the voltages effective at or in the chip.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

The FIGURE illustrates a circuit diagram in accordance with the preferred embodiment of the present invention.

Proceeding now to the detailed description of the drawing, FIG. 1 illustrates schematically a portion of an integrated circuit chip 10 with active elements of the MOSFET variety. The chip may pertain to a calculator assembly and comprise storage facilities for a minicalculator. By way of example, the chip may be of the variety traded under the designation EA 7022 by the assignee corporation.

Aside from numerous active circuits, the chip may include signal paths which are destined to lead out of the chip for purposes of controlling output devices such as display tubes. Particularly, device 12 may be a segment of a display device which has seven such segments arranged in an "8" pattern. The connection may lead particularly to the cathode of such glow discharge segment. The chip, therefore, has an interface 11 and connections lead from that interface to display tubes or segments such as 12.

The MOS-chip by its nature is a relatively low voltage operated and operating device, and operating bias is in the neighborhood of −30 volts (for P-channel devices); the voltages $V_{DD}$ and $V_{bias}$ may be at that level. By way of example, circuit 13 is an inverter which receives a display control signal via a signal path 14 from the interior of the chip for control of the gate of an output MOSFET 15, which is, of course, still inside the chip.

Control transistor 15 has its source electrode grounded and its drain electrode is the output. That output, however, does not lead directly to an output terminal of the chip. Rather, in accordance with the specific feature of the invention, a second MOSFET 16 is serially connected to transistor 15 and the drain electrode of MOSFET 16 leads through an internal resistor 18 to an output lead or terminal 19, which traverses the interface 11. Terminal 19 may include the usually pin connection from a connecting pad on the chip through a wire to the usual terminal of a packaged MOSFET chip.

The junction connection 17 between the drain electrode of control transistor 15 and the source electrode of biased transistor 16 must be isolated so that conduction through the conductive FET 16 can occur only when control transistor 15 is conductive. Conceivably, other control transistors could operate here in parallel in a logic-OR configuration. Isolation of point 17, therefore, is to mean merely that no other device should be provided for through which the potential at the drain electrode of transistor 16 could be applied to a nonconductive device or any other external bias under actual conduction of transistor 16.

External to the chip 10 and as part of the interface circuitry, there is provided a biasing circuit for applying, e.g., −55 volts to the interface connection 19 via line 19'. A series capacitor 20 and a reversely biased diode 21 raise the potential at point 22 to −177 volts or to −122 volts only, depending on the potential of output 19–19'. That voltage swing from −122 to −177 volts (relative to ground) as applied, e.g., to the cathode, suffices to control the display tube 12 between conduction breakdown and nonconduction (for grounded anode). This control can be provided for without intervention of an active (transistor) control element external to the chip 10.

In operation, and assuming at first that the control signal at 14 is near ground, control transistor 15 is gated on and rendered conductive. Therefore, current is permitted to flow through transistors 15, 16, and the drain electrode of biased transistor 16 is at ground potential minus the two serial voltage drops across these FETs. Another voltage drop occurs across resistor 18 and the potential at lines 19, 19', is about −18 volts or thereabouts. Accordingly, point 22 is raised in potential to render diode 21 conductive so that about −122 volts is applied to point 22 and transmitted to tube 12. This is insufficient for voltage break-through.

If the signal in line 14 drops to more negative values so that ground or near ground potential is applied by the inverter 13 to the gate of transistor 15, the transistor 15 is nonconductive, and −55 volts is applied between line 19 and ground and is effective across serially connected transistors 15 – 16. Transistor 16 is still biased conductive but becomes non-conductive as soon as node 17 charges to one threshold above the gate voltage (pinchoff). Therefore, point 17 has a potential of ~ −24 volts −(−5 volts) ≅ −19 volts, which is above the field enhanced breakdown voltage for the transistor 15 which remains nonconductive.

Assuming little or no leakage occurs across or through capacitor 20, the full −55 volts are transmitted to point 22 whose potential was previously about −122 volts and whose potential now drops to −177 volts, which is sufficient for firing a discharge tube or segment 12. This control function is provided without power or high voltage transistor outside of chip 10, but solely through regular FET 15 as protected by FET 16.

It can readily be seen that the MOSFET chip, through the particular output circuit 13-15-16-17-18 controls the potential at point or line 19 to vary down from a value well in excess of the MOSFET breakdown voltage, while the voltage swing at point 19 is effective at point 22 as a swing between much higher levels through the capacitive isolation. The bias as applied to the chip output terminal merely defines and provides for the swing range at the controlled device 12, but the range needed here is in excess of the range permitted inside of the MOSFET chip; the invention as explained permits control of application of that control range without affecting directly any individual active element in chip 10.

The voltages referred to are mentioned here only by way of example, decisive is that the biasing potential against ground at point 19 is significantly lower than the voltage drop a MOSFET in the chip can withstand. The difference is taken up by the voltage drop produced across conductive FET 16 by operation of its gate.

Resistor 18 is not a requirement of the invention but is normally included to protect mosfet 16 from static discharge.

The invention is not limited to the embodiments described above but all changes and modifications thereof not constituting departures from the spirit and scope of the invention are intended to be included.

I claim:

1. In an integrated circuit chip of the MOSFET variety having an output terminal to be controlled as to effective voltage potential, and to which is applied a biasing voltage having value relative to ground in excess of the MOSFET breakdown voltage the improvement of:

an output circuit in the MOSFET chip as connected between said terminal and ground in the chip, and having a first FET-transistor having its gate controlled from internal circuitry in the chip between conduction and non-conduction, the output circuit further having a second FET-transistor having its gate controlled by a particular voltage for being permanently biased to conduction, and serially connected to the first transistor, the common drain-to-source junction of the first and second transistors being isolated from any other non-ground external bias for maintaining the second FET non-conducting except upon drop to ground or near ground potential of the potential at said junction, so that the potential of the drain of the second MOSFET is not being applied to any other MOSFET in the chip under conditions of conduction of the second FET transistor; and said serially connected first and second transistors being connected between ground and said terminal, so that said excess biasing voltage is applied to the drain of the second FET and for non-conductive first transistor the effective voltage across its main electrodes is composed of said biasing voltage as reduced by the gate voltage as applied to the gate of said second transistor.

2. Circuit as in claim 1, wherein a voltage breakdown device is connected to said output terminal.

3. Circuit as in claim 2, wherein the voltage breakdown device is connected to said output terminal via a passive circuit.

4. Circuit as in claim 3, wherein the voltage break down device is a discharge display tube connected to said terminal via a capacitor having first and second electrodes, the first electrode being biased via a reversely biased diode, so that the potential at the second electrode drops to the sum of the bias as applied to the diode and the said biasing voltage as applied to said output terminal upon non-conduction of the first transistor.

* * * * *